United States Patent
Sharma et al.

(10) Patent No.: US 11,476,857 B2
(45) Date of Patent: Oct. 18, 2022

(54) INTERLEAVING ERRORS SOURCES AND THEIR CORRECTION FOR RF DACS

(71) Applicant: TEXAS INSTRUMENTS INCORPORATED, Dallas, TX (US)

(72) Inventors: Rahul Sharma, Bangalore (IN); Aswath Vs, Kerala (IN); Sriram Murali, Karnataka (IN); Prasad Gandewar, Bangalore (IN); Sandeep Kesrimal Oswal, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/072,225

(22) Filed: Oct. 16, 2020

(65) Prior Publication Data

US 2021/0126644 A1    Apr. 29, 2021

(30) Foreign Application Priority Data

Oct. 25, 2019 (IN) .............................. 201941043434

(51) Int. Cl.
*H03M 1/06* (2006.01)
*H04L 1/00* (2006.01)
*H04W 88/08* (2009.01)

(52) U.S. Cl.
CPC ........ *H03M 1/0607* (2013.01); *H04L 1/0071* (2013.01); *H04W 88/08* (2013.01)

(58) Field of Classification Search
CPC ............. H03M 1/0607; H03M 1/0836; H03M 1/1057; H03M 1/0624; H03M 1/662; H04L 1/0071; H04W 88/08

USPC .......................................................... 455/73
See application file for complete search history.

(56) References Cited

U.S. PATENT DOCUMENTS

| 8,836,551 B2 * | 9/2014 | Nozaki ................... H03M 1/06 341/118 |
| 9,553,598 B2 * | 1/2017 | Nozaki ............... H03M 1/0604 |
| 9,608,652 B2 * | 3/2017 | Lee ........................ H03M 1/123 |
| 9,654,133 B2 * | 5/2017 | Speir ..................... H03M 1/128 |

(Continued)

OTHER PUBLICATIONS

Olieman, et al.: "An Interleaved Full Nyquist High-Speed DAC Technique"; IEEE Journal of Soli-State Circuits, vol. 50, No. 3, Mar. 2015; p. 704-713.

(Continued)

*Primary Examiner* — Juan A Torres
(74) *Attorney, Agent, or Firm* — John R. Pessetto; Charles A. Brill; Frank D. Cimino

(57) ABSTRACT

Analog gain correction circuitry and analog switching clock edge timing correction circuitry can provide coarse correction of interleaving errors in radio-frequency digital-to-analog converters (RF DACs), such as may be used in 5G wireless base stations. The analog correction can be supplemented by digital circuitry configured to "pre-cancel" an interleaving image by adding to a digital DAC input signal a signal equal and opposite to an interleaving image created by the interleaving DAC, such that the interleaving image is effectively mitigated. Error correction control parameters can be periodically adjusted for changes in temperature by a controller coupled to an on-chip temperature sensor. A model useful for understanding the sources of error in interleaving DACs is also described.

22 Claims, 11 Drawing Sheets

(56) References Cited

U.S. PATENT DOCUMENTS

| | | | | |
|---|---|---|---|---|
| 2013/0027233 | A1* | 1/2013 | Nozaki | H03M 1/0626 |
| | | | | 341/118 |
| 2016/0020781 | A1* | 1/2016 | Baringer | H03M 3/46 |
| | | | | 341/110 |
| 2016/0182073 | A1* | 6/2016 | Speir | H03M 3/382 |
| | | | | 341/120 |
| 2017/0237419 | A1* | 8/2017 | Clara | H03K 5/13 |
| | | | | 327/231 |

OTHER PUBLICATIONS

Deveugele, et al.: "Parallel-Path Digital-to-Analog Converters for Nyquist Signal Generation"; IEEE Journal of Solid-State Circuits, vol. 39, No. 7, Jul. 2004, p. 1073-1082.

\* cited by examiner

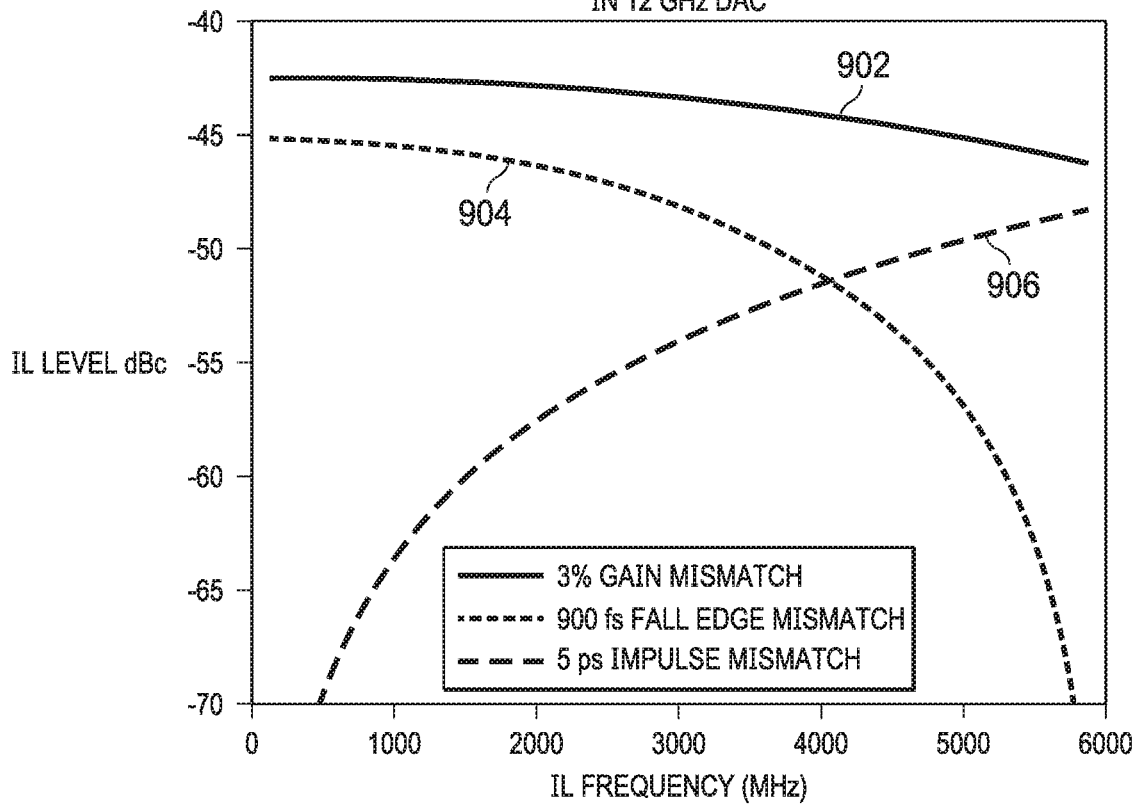
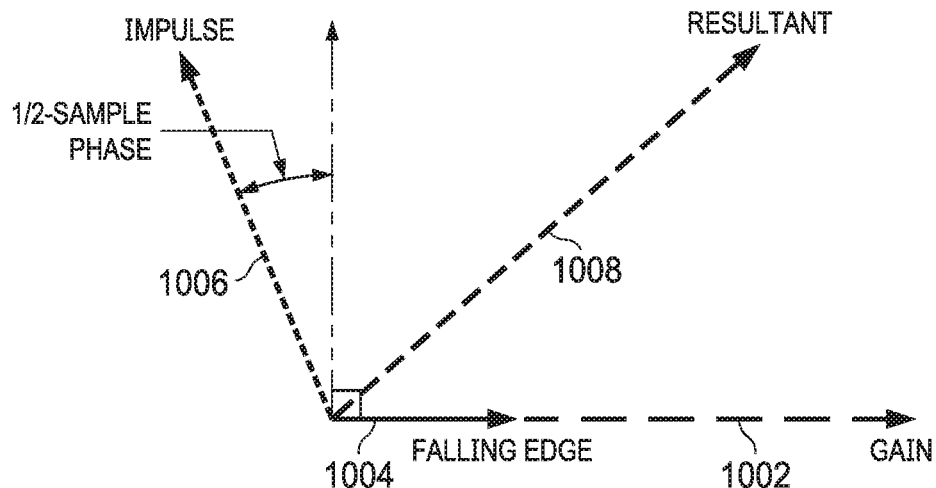

INTERLEAVING ERRORS SOURCES AND THEIR CORRECTION FOR RF DACS

CROSS-REFERENCE TO RELATED APPLICATION

This application claims priority to Indian provisional patent application No. 201941043434 filed Oct. 25, 2019.

TECHNICAL FIELD

The present application relates generally to electronic circuits, and more specifically to correction of interleaving errors in radio-frequency digital-to-analog converters.

BACKGROUND

Radio-frequency (RF) sampling transceivers can be used in wireless base stations, for example, those used in the fifth generation wireless technology for digital cellular networks known as "5G." In an RF sampling transmitter, an RF signal is generated directly with a high-speed, high-performance digital-to-analog converter (DAC) (e.g., one that operates at 14 bits, 12 gigasamples per second), thereby avoiding the need for mixers in the RF/analog domain. This architecture can enable simultaneous multi-band transmission by employing digital up-converters (DUCs) for each of several bands originating from respective digital signals, using just a single RF/analog transmitter chain.

In the DAC context, spurious-free dynamic range (SFDR) is the ratio of the root-mean-square (RMS) value of the carrier wave (i.e., the maximum signal component) at an output of a DAC to the RMS value of the next largest noise or harmonic distortion component, which is referred to as "spurious" or a "spur" at the DAC's output. SFDR can be measured in decibels relative to the carrier signal amplitude (dBc). Depending on the test condition, SFDR is observed within a pre-defined frequency window or from DC up to Nyquist frequency of the DAC.

SUMMARY

An example interleaving digital-to-analog converter (DAC) system includes an interleaving DAC having an analog signal output and first and second DACs. Each of the first and second DACs having an independently adjustable bias voltage. The first and second DACs also have respective first and second digital signal inputs. The system further includes analog switching clock edge timing adjustment circuitry configured to independently adjust the timing of rising and falling edges of first and second digital switching clock signals used by the interleaving DAC. A voltage of the analog signal output of the interleaving DAC is a voltage output of the first DAC during a high value of the first digital switching clock signal and a voltage output of the second DAC during a high value of the second digital switching clock signal. The system can further include further digital interleaving image pre-canceler circuitry coupled to inputs of the first and second DACs. The digital interleaving image pre-canceler circuitry is configured to generate a digital signal including an anti-interleaving image equal and opposite of an interleaving image produced by the interleaving DAC.

An example method of interleaving error correction includes coarse analog correction of gain mismatch in an interleaving DAC comprising first and second DACs, performed by independently adjusting first and second biasing voltages respectively provided to the first and second DACs. The method can further include coarse analog correction of switching clock edge timing mismatch, performed by adjusting supply currents provided to current-starved inverters in series with clock signal supply lines. The coarse analog correction of the gain mismatch and the switching clock edge timing mismatch reduce the magnitude of an interleaving image in the output of the interleaving DAC. The method can further include performing fine digital correction of switching clock edge timing mismatch by generating in a digital input signal provided to the interleaving DAC an anti-interleaving image equal and opposite to the interleaving image, and performing fine digital correction of gain mismatch in the interleaving DAC by digitally scaling the input to the first or the second DAC. The fine digital correction of the switching clock edge timing mismatch and the gain mismatch further reduces the magnitude of the interleaving image in the output of the interleaving DAC.

An example wireless base station transceiver system includes a baseband processor, an integrated transceiver, a power amplifier, and an RF port. The baseband processor is configured to provide complex baseband I/Q samples via an output. The integrated transceiver has a first input, coupled to the output of the baseband processor, and a first output. The integrated transceiver is configured to interpolate, filter, and up-convert the complex baseband I/Q samples to an RF frequency. The integrated transceiver includes a radio-frequency (RF) sampling transmitter comprising a transmitter (TX) digital up-converter (DUC) having an output, and an RF sampling DAC having a sample-and-hold response, the RF sampling DAC having an input coupled to the output of the TX DUC. The RF sampling transmitter further includes interleaving image correction circuitry configured to correct for sources of interleaving error by providing coarse analog correction and fine-grained digital pre-cancellation. The power amplifier has an input coupled to the first output of the integrated transceiver. The power amplifier is configured to amplify an analog RF output signal from the integrated transceiver. The RF port is coupled to an output of the power amplifier and is configured to transmit the amplified analog RF output signal from the power amplifier.

BRIEF DESCRIPTION OF THE DRAWINGS

FIG. 9 is a graph showing example contributions of three different interleaving mismatch components in a 12 GHz DAC.

FIG. 10 is a phasor diagram showing the relationship between example mismatch terms.

DETAILED DESCRIPTION

Despite being line-powered, wireless base-station transmitters of the type used, for example, in 5G infrastructure can be highly power-sensitive because of high electricity running costs and thermal management challenges. Digital-to-analog converters (DACs) tend to be among the most power-consuming circuit blocks in integrated quad-channel transceivers used in wireless base-station infrastructure. Thus, reducing the power used by DACs aids greatly in addressing overall power consumption of base-station transmitters.

Figure 3:
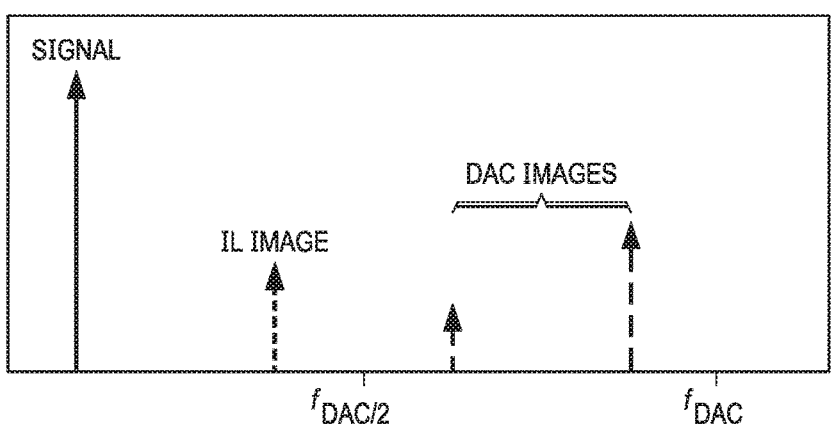
FIG. 3 is a frequency plot showing the placement of an interleaving (IL) image created as an artifact of interleaving DAC operation relative to an input signal and DAC images.

High-speed radio-frequency (RF) DACs can be used in sampling transceivers used, for example, in such 5G wireless base stations. Higher DAC speeds can be achieved by interleaving multiple DACs each operating at a lower frequency than the desired combined frequency (e.g., half the rate of the desired DAC sampling rate $f_{DAC}$), operating at lower dynamic power consumption, having less harmonic distortion, and better adjacent-channel power ratio (ACPR) than a single higher-speed DAC. However, in a two-way interleaved DAC, as an artifact of mismatches between the two DACs, a scaled image of the desired output signal can occur at a frequency that is the difference between half the DAC sampling frequency and the input frequency, i.e., $f_{DAC}/2-f_{in}$. Such a scaled image is known as an interleaving image ("IL image"). The frequency of an IL image is shown relative to the signal frequency in the frequency plot of FIG. 3, which shows the magnitude of the output spectrum according to frequency. As an example, the raw mismatches in analog may result in an interleaving image as high as −40 dBc (forty decibels below the main signal); it would be desirable, for example, to correct this to a much lower level, e.g., at least −55 dBc or −60 dBc.

Figure 1:
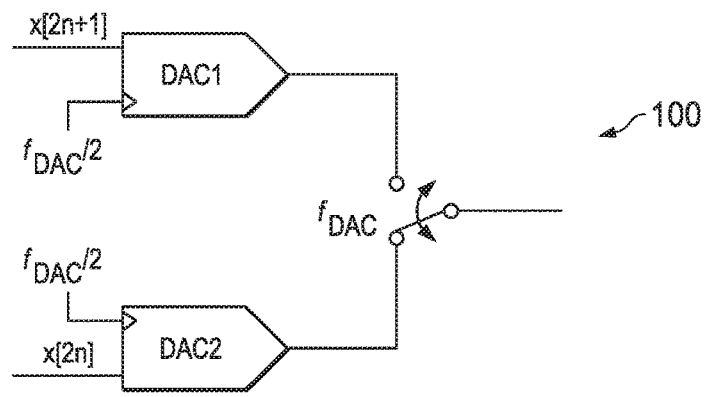
FIG. 1 is a circuit diagram of an example model of an interleaving digital-to-analog converter (DAC).
Figure 2:
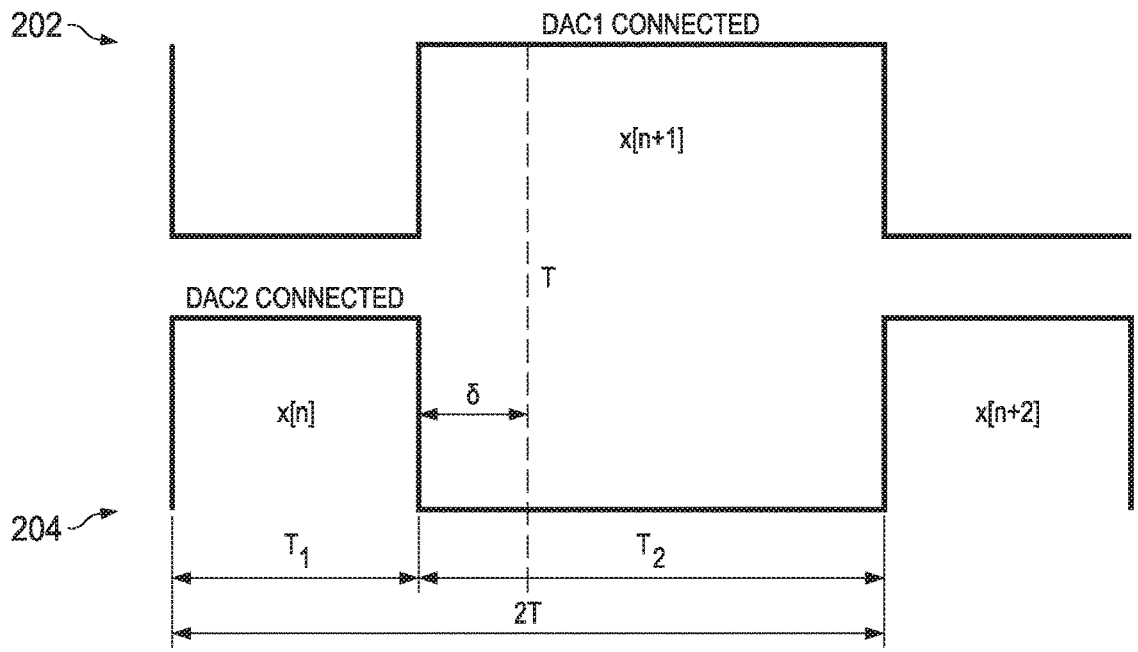
FIG. 2 is a timing diagram of example switching signals corresponding to the model of FIG. 1.

One way of modeling a timing-mismatched interleaved DAC, as shown in FIG. 1, has two DACs DAC1, DAC2 with different gains and a switch that switches between the two DACs at the sampling rate $f_{DAC}$ but with a skewed duty ratio. The timing diagram of FIG. 2 shows timing signals 202, 204 illustrating duty cycle differences between the two DACs of FIG. 1. Period 2T in FIG. 2 corresponds to the time expended to send two samples out of the combined DAC 100. Because model 100 involves only one switch, timing signals 202 and 204 are logical complements of each other, but they may still have some duty ratio skew. As shown in FIG. 2, period 2T is composed of two unequal sub-periods $T_1$, during which one of the two DACs, DAC2, is connected to the output, and $T_2$, during which the other of the two DACs, DAC1, is connected to the output. The difference between $T_2$ and $T_1$ can be denoted by time difference δ. An interleaving image (e.g., IL IMAGE in FIG. 3) can result at least in part from this skewed duty ratio. In some examples, a correction may be applied by adjusting the duty ratio of the switching pulse using the falling edge of the switching pulse and controlling the gain on the mismatched DAC, both in analog.

Figure 4:
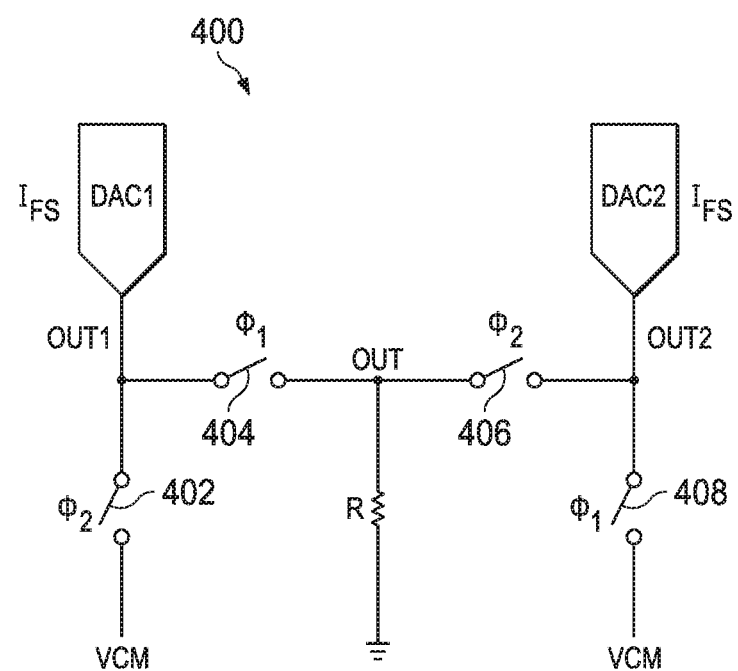
FIG. 4 is a circuit diagram of an example model of an interleaving DAC.

FIG. 4 illustrates another interleaved DAC model 400 involving four switches 402, 404, 406, 408 connecting the respective outputs of two DACs DAC1, DAC2 either to an output node OUT or to a common mode voltage node VCM, which can be a circuit ground or some other constant potential. DAC1 and DAC2 can be, for example, current-steering DACs. Current is sunk through an output load, modeled as resistor R, to produce an output voltage at output node OUT.

Figure 5:
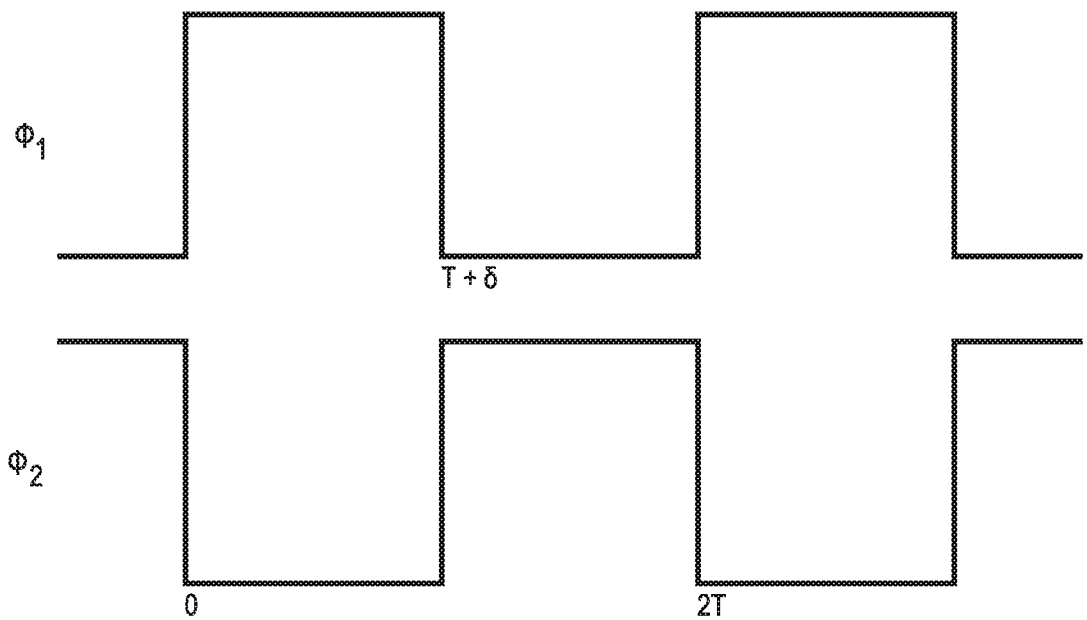
FIG. 5 is a timing diagram of example switching signals corresponding to the model of FIG. 4.

At any given time, switches 404 and 408 both have the same open or closed state corresponding to the timing signal $\phi_1$ shown in FIG. 5, and switches 402 and 406 both have the same open or closed state corresponding to the timing signal $\phi_2$ shown in FIG. 5. For example, a "high" signal in the $\phi_1$ or $\phi_2$ signals can correspond to a closed switch (permitting current flow). DAC1's output OUT1 is provided to the combined output node OUT when switch 404 is closed. DAC2's output OUT2 is provided to the combined output node OUT when switch 406 is closed. Corresponding timing diagram FIG. 5 shows period 2T signifying the time expended to send two samples out of the combined DAC 400. The end of the $\phi_1$ "on" period differs from half the full period 2T by some time difference δ. In model 400, the timing mismatch is modeled by the parameter δ alone. Model 400 does not account for any mismatch in the two DAC currents, assuming them to be the same, $I_{FS}$, for both DAC1 and DAC2. This model does not correctly predict the frequency dependence of the interleaving image level. An interleaving image expression for this model, calculated as $\text{sinc}(f_{imag}/2T)(1+e^{-j\pi(T+\delta)/T})$, may not properly give frequency dependence of the interleaving image level seen in a practical DAC.

Systems and methods described herein recognize that factors contributing to interleaving mismatch include all three of (1) gain mismatch between DACs, (2) mismatch in the switching clocks, including both mismatches between rising edges and mismatches between falling edges, and (3) component mismatches at the outputs of the DACs. A more complete model of DAC switching than the ones illustrated in FIGS. 1 and 2 or FIGS. 4 and 5, along with associated analog and digital correction mechanisms to address the modeled non-idealities, can yield a finer suppression of the IL image, along with temperature tracking.

Figure 6:
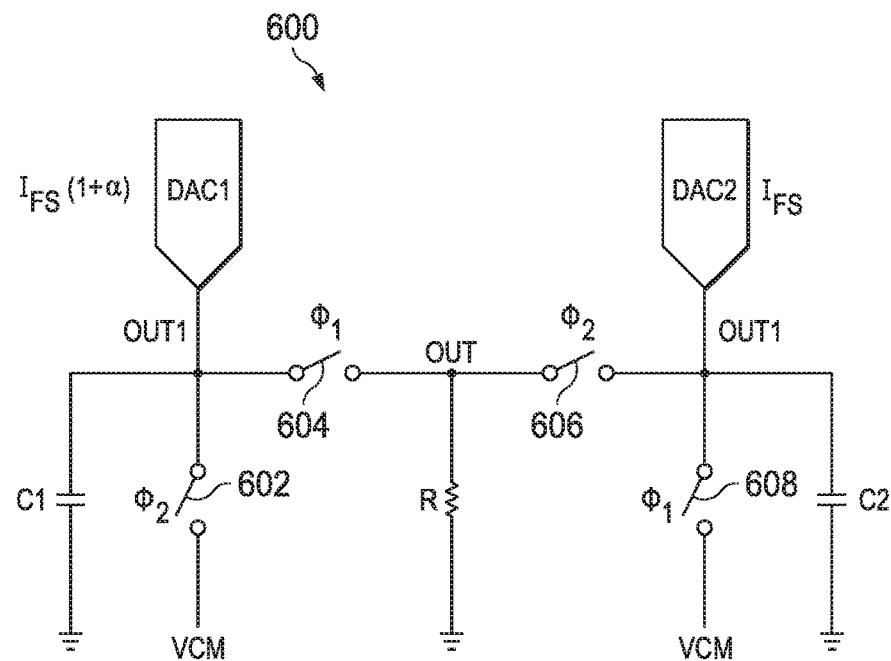
FIG. 6 is a circuit diagram of an example model of an interleaving DAC.
Figures 7, 8:
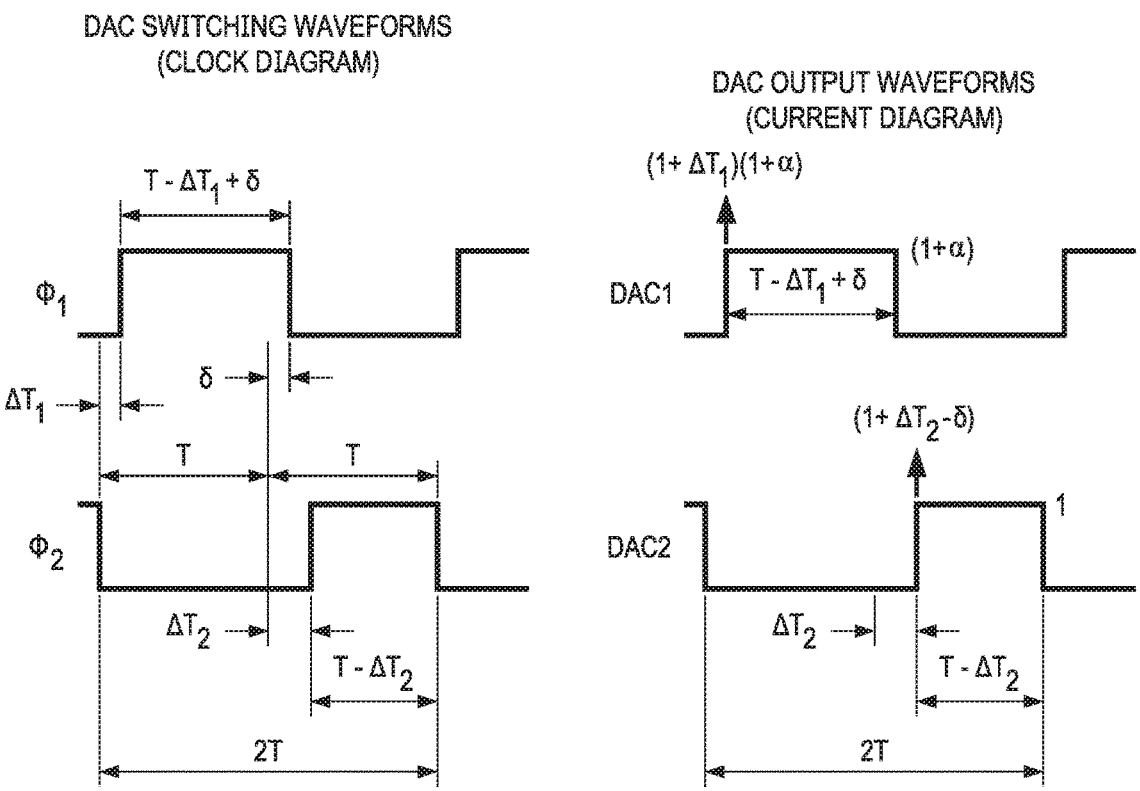
FIG. 7 is a timing diagram of example switching signals corresponding to the model of FIG. 6.
FIG. 8 is a timing diagram of example DAC output current signals corresponding to the model of FIG. 6.

FIG. 6 is a circuit diagram of an interleaved DAC model 600 that captures gain and timing mismatches. A corresponding diagram of clock signals is shown in FIG. 7 and a corresponding diagram of DAC output current signals is shown in FIG. 8. Four switches 602, 604, 606, 608 connect the respective outputs of two DACs DAC1, DAC2 either to an output node OUT or to a common mode voltage node VCM. At any given time, switches 604 and 608 both have the same open or closed state corresponding to the timing signal $\phi_1$ shown in FIG. 7, and switches 602 and 606 both have the same open or closed state corresponding to the timing signal $\phi_2$ shown in FIG. 7. DAC1's output OUT1 is provided to the combined output node OUT when switch 604 is closed. DAC2's output OUT2 is provided to the combined output node OUT when switch 606 is closed.

Corresponding timing diagram FIG. 7 shows period 2T signifying the time expended to send two samples out of the combined DAC 600. From FIG. 7 it may be noted that the on times $\phi_1$ and $\phi_2$ may be unequal to each other, and the "dead times"—the gaps between the falling edge of $\phi_2$ and the rising edge of $\phi_1$, and between the falling edge of $\phi_1$ and the rising edge of $\phi_2$—may also be unequal to each other. The start of the $\phi_2$ "on" period differs from half the full period 2T by time amount $\Delta T_2$. The end of the $\phi_1$ "on" period differs from half the full period 2T by some time difference $\delta$. The $\phi_1$ "on" period differs from the $\phi_2$ "on" period $T-\Delta T_2$ by some error time amount $\delta-\Delta T_1+\Delta T_2$. The clock skews can be modeled using three parameters $\delta$, $\Delta T_1$, and $\Delta T_2$. Additionally, there may be a mismatch in the two DAC currents, $I_{FS}$ (for DAC2) and $I_{FS}(1+\alpha)$ (for DAC1), which can be modeled by the parameter $\alpha$. Gain and timing mismatches between the two DACs lead to an interleaving image, as described above. DAC1 is connected to output during phase $\phi_1$. Between $\phi_1$ and $\phi_2$, there is non-overlap time $\Delta T_2-\delta$. As a result of the illustrated timing error sources, the samples x(2n) and x(2n+1) effectively experience different non-overlapping pulse shapes.

Unlike model 400, model 600 further includes discharge capacitors C1, C2, which model parasitic capacitances that exist in a practical interleaved DAC circuit. During a first "dead time" when $\phi_1$ goes low and both switches 606, 608 are open, current from DAC2 is integrated on capacitor C2 and the charge thus accumulated flows into output load resistor R when $\phi_2$ subsequently goes high, closing switch 606. Similarly, during a second "dead time" when $\phi_2$ goes low and both switches 602, 604 are open, current from DAC1 is integrated on capacitor C1 and the charge thus accumulated flows into output load resistor R when $\phi_1$ subsequently goes high, closing switch 604.

Although not shown in the DAC output signals of FIG. 8, the initial impulse current discharge of these capacitors introduces an exponential decay term in the voltage output from the DACs. Although the impulse currents are smeared by the finite RC time constant of the discharge path, for a digital correction circuit, a current-domain model suffices, and the exponential decay in the voltage output as a result of capacitor discharge into the output load can be ignored. As shown in FIG. 8, the effective pulse shapes that sample alternate even and odd samples have both different pulse widths and different pulse amplitudes, and both exhibit an impulse behavior at the beginning of the pulse.

From the model of the sources of interleaving DAC mismatch illustrated in FIGS. 6-8, an expression for the interleaving image as a function of frequency can be derived, which expression can be used to parametrically counteract the interleaving image with analog and digital circuitry. For a general input signal with frequency profile G(f), the frequency profile of the interleaving image with all the mismatches discussed above is, to first order approximations, of the form:

$$IL\ \text{Image}(f) = \left\{ \left[ \frac{\alpha}{2}\text{sinc}(fT) + \frac{2\delta}{T}\cos(\pi fT) \right] - j2\pi fT\frac{\Delta T_2^2 - \Delta T_1^2 - 2\Delta T_2\delta}{T^2}e^{j\pi fT} \right\}$$
$$G(f - f_0)$$

In the above expression, f is the IL image frequency and $f_0$ equals $f_{DAC}/2$. The first term within the braces, having $\alpha$ in it, can be referred to as a gain mismatch term. The second term within the braces, having $\delta$ in it, can be referred to as a falling edge mismatch term. The third term, having the expression $\Delta T_2^2-\Delta T_1^2-2\Delta T_2\delta$ in it, can be referred to as an impulse discharge term, and the expression $\Delta T_2^2-\Delta T_1^2-2\Delta T_2\delta$ can be referred to as $\gamma$. Contrary to the understanding derived from other interleaving DAC models, which may assume that an interleaving image amplitude is not very large for low-frequency input signals, this third (impulse discharge) term shows that timing mismatch can lead to an interleaving image even for very low-frequency input signals, including at DC.

The graph of FIG. 9 illustrates the contribution to the interleaving image amplitude of each of the three terms in the above expression for a twelve-gigahertz interleaved DAC. The horizontal axis, interleaving image frequency, ranges from DC to $f_{DAC}/2$ (six gigahertz). A low interleaving image frequency corresponds to a high input frequency. The vertical axis, interleaving image level, ranges from −70 to −40 dBc. The mismatch parameters in the illustrated example include a three-percent gain mismatch 902, a nine-hundred femtosecond falling edge mismatch 904, and a five picosecond impulse discharge 906. The gain mismatch term is in phase with the input and has a sinc response. The falling edge mismatch term signifies a difference between a falling edge of one clock signal and an ideal falling edge time for that clock signal. As shown in FIG. 9, this term is dominant at low interleaving image frequencies, and vanishes at high interleaving image frequencies (i.e., at low signal frequencies). The impulse discharge term, however, contributes more greatly to the interleaving image at higher interleaving mismatch frequencies. The illustrated partitioning of the contributions of the interleaving mismatch components demonstrates how an interleaving image can occur even for very low-frequency input signals.

The gain mismatch and falling edge mismatch terms are in phase with respect to each other and are in quadrature with the impulse discharge term with a half-sample advancement. FIG. 10 is a phasor diagram illustrating an example relationship between the gain mismatch term (illustrated by phasor 1002), the falling edge term (illustrated by phasor 1004), and the impulse discharge term (illustrated by phasor 1006), and also shows the resultant phasor 1008 of the three terms. All three terms are frequency-dependent.

Figure 11:
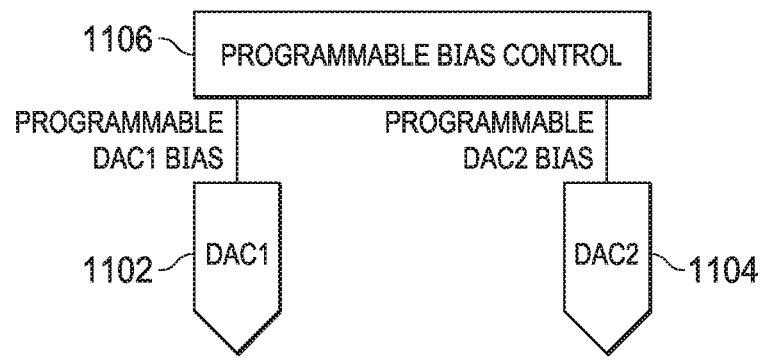
FIG. 11 is an illustration of independently programmable biases being provided from a programmable bias control to the two DACs of an interleaving DAC.
Figure 13:
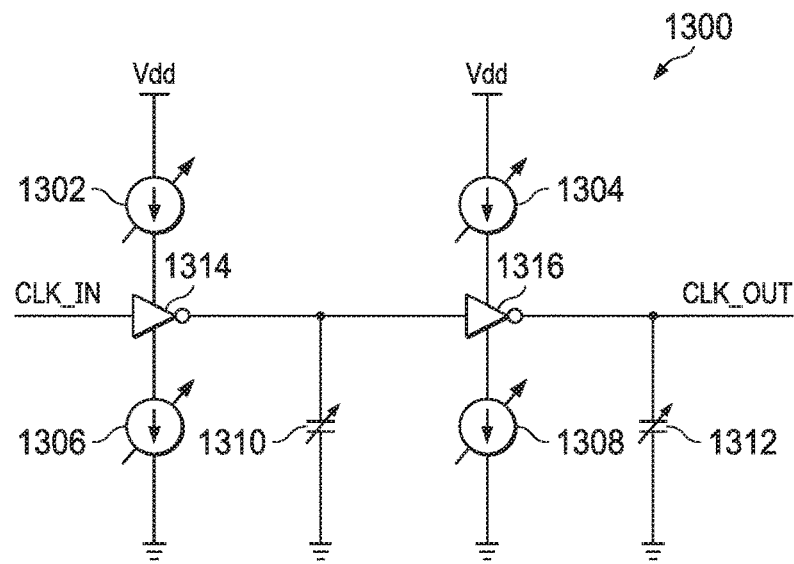
FIGS. 13 and 14 are circuit diagrams of example analog switching signal edge timing adjustment circuitry.
Figure 14:
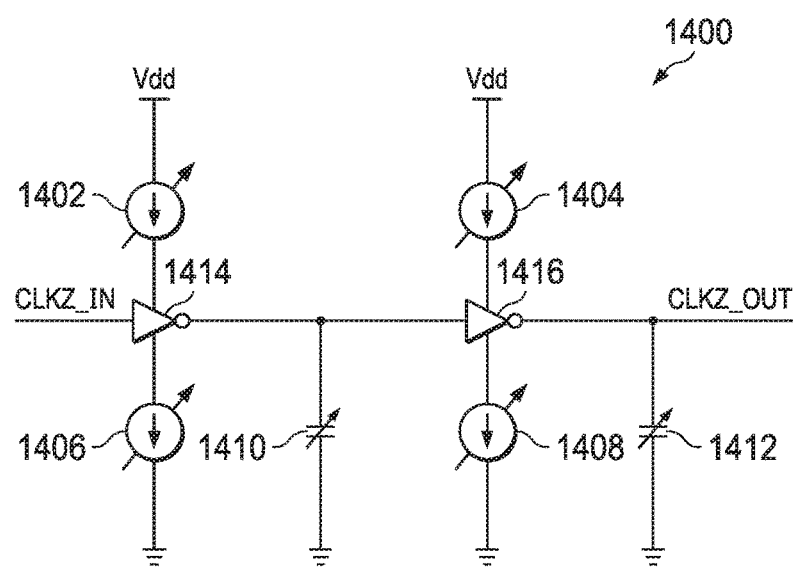

In view of the above model, analog correction, digital correction, or both can be implemented to suppress the interleaving image. As an example, first, coarse trim can be done in analog, as shown in FIGS. 11, 13, and 14, and mismatch residue after analog trim can be corrected in the digital domain, as shown in FIGS. 17-21 and 23. In other examples, only analog correction circuitry can be supplied, or only digital correction circuitry, in either case still taking into account the above-described timing-mismatch model.

FIG. 11 shows that the bias voltage going to each DAC, DAC1 1102, DAC2 10024, can be independently controlled with programmable bias voltage values supplied by programmable bias control 1106 to reduce the gain error, in effect addressing the gain mismatch term in the above expression. The output current of each DAC 1102, 1104 is proportional to the bias voltage value provided to each respective DAC 1102, 1104. Gain mismatch arises from inequality in DAC1 1102 and DAC2 1104 output currents in the interleaving DAC. Making both of the bias voltages supplied to the two DACs programmable permits the two output currents of the two DACs 1102, 1104 to be equalized.

Figure 12:
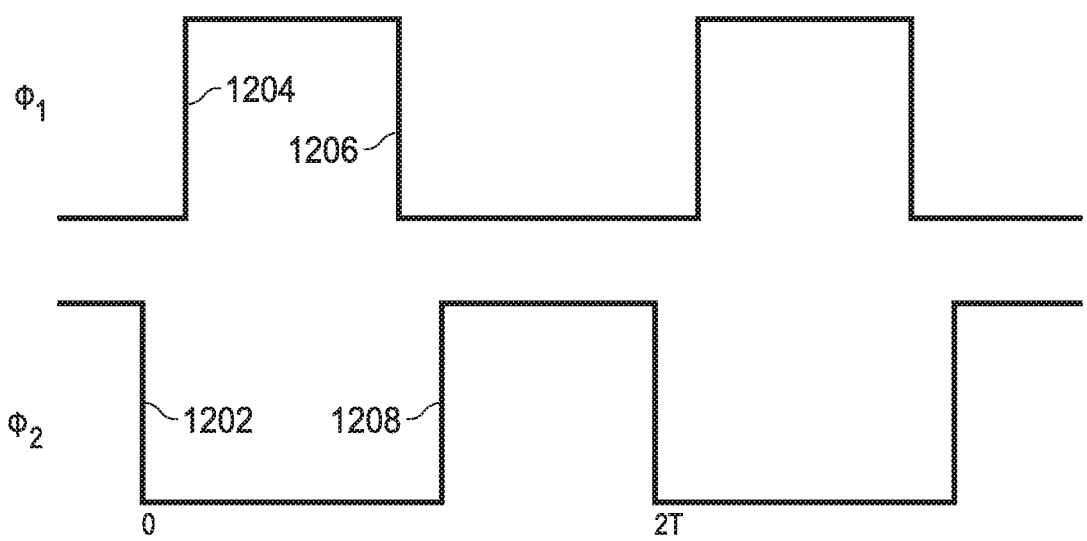
FIG. 12 is a timing diagram of example switching signals.

Still as part of coarse analog correction, to reduce timing error, both rising edges 1202, 1204 and falling edges 1206, 1208 of signals $\phi_1$ and $\phi_2$ as shown in FIG. 12 can be made independently programmable. $\phi_1$ and $\phi_2$, it may be noted from FIG. 12, need not be symmetric, as may be the case under ideal conditions. Calibration, which may be manual or automated, can be used to determine whether to advance or delay any particular edge 1202, 1204, 1206, 1208. Analog delay programmability for each of the DAC paths can be achieved in a variety of ways. One example of circuitry for providing analog delay programmability is illustrated with FIGS. 13 and 14. Another example of circuitry for providing analog delay programmability is illustrated with FIGS. 15 and 16.

FIG. 13 shows example analog clock edge adjustment circuitry comprising a number of stages of inverters 1314, 1316 and capacitors 1310, 1312 in a first switching clock path 1300 corresponding, for example to the $\phi_1$ switching signal. FIG. 14 shows similar example analog clock edge adjustment circuitry comprising a number of stages of inverters 1414, 1416 and capacitors 1410, 1412 in a second switching clock path 1400 corresponding, for example, to the $\phi_2$ switching signal. Although two stages are shown in each drawing of FIGS. 13 and 14, the analog clock edge adjustment circuitry for either switching clock can have more or fewer stages than two. Adjusting programmable current sources 1302, 1304, 1306, 1308, 1402, 1404, 1406, 1408 feeding current-starved inverters 1314, 1316, 1414, 1416 can be used to change the rise/fall time of multiplexer clocks respectively controlling the $\phi_1$, $\phi_2$ switching signals. Programmable capacitors 1310, 1312, 1410, 1412 can be used and value-adjusted as part of the calibration if it is desired to move both rising and falling edges in the same direction. These programmable capacitors 1310, 1312, 1410, 1412 are illustrated as being with reference to a circuit ground, but in other examples could be referred to a supply voltage or to any other convenient common-mode voltage. The rise and fall time of multiplexer clock edges can thus be controlled independently using the analog circuitry shown in FIGS. 13 and 14 to advance or delay clock edges and increase the symmetricity of switching signals $\phi_1$, $\phi_2$. Although there may be benefits to distributing the programmability over multiple inversion stages of the analog clock edge adjustment circuitry, clock signal noise may be increased with a greater number of stages. Thus, the optimal number of inversion stages for a given design may depend on the desired amount of edge delay or advance adjustability.

Figure 15:
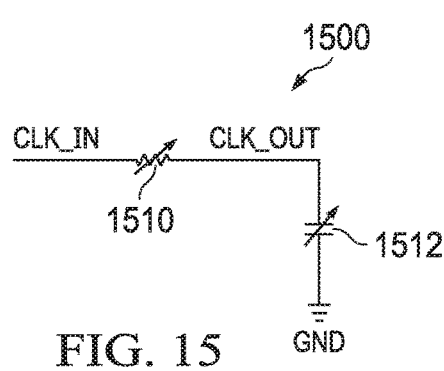
FIGS. 15 and 16 are circuit diagrams of other example analog switching signal edge timing adjustment circuitry.
Figure 16:
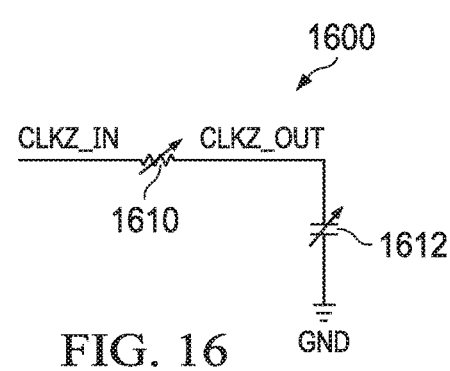

FIGS. 15 and 16 show other example analog clock edge adjustment circuitry that can be used to adjust the rise and fall times of $\phi_1$ and $\phi_2$ switching signals. In circuit 1500 of FIG. 15, the input clock signal CLK_IN comes from an inverter (not shown) and is delayed by a programmable RC delay circuit 1500, in which the values of both resistor 1510 and capacitor 1512 can be independently programmed. CLK_OUT drives another inverter (not shown). Similarly, in circuit 1600 of FIG. 16, the input clock signal CLKZ_IN comes from an inverter (not shown) and is delayed by a programmable RC delay circuit 1600, in which the values of both resistor 1610 and capacitor 1612 can be independently programmed. CLKZ_OUT drives another inverter (not shown). Multiple such sections can be cascaded to obtain greater programmability on both CLK and CLKZ. Programmable capacitors 1512, 1612 are illustrated as being with reference to a circuit ground, but in other examples could be referred to a supply voltage or to any other convenient common-mode voltage.

Figure 17:
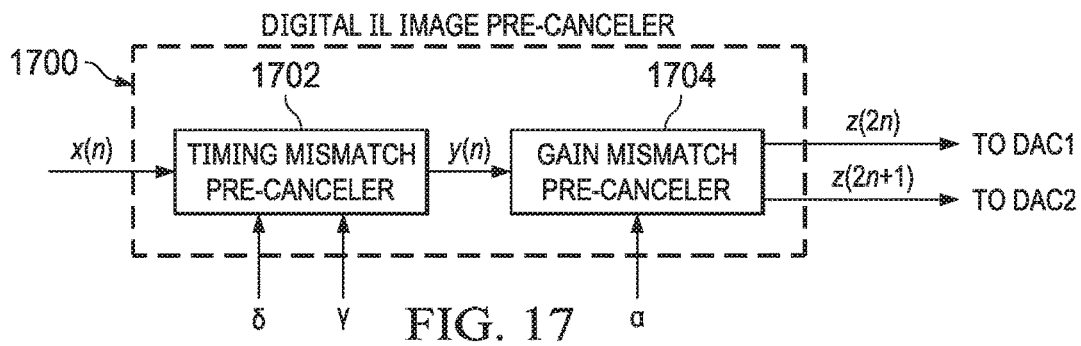
FIG. 17 is a block diagram of an example digital interleaving image pre-canceler.

The above-described analog correction can be capable of improving mismatch error in the interleaving DAC, but remaining mismatch error can be further ameliorated using digital correction circuitry to "pre-cancel" an interleaving image produced by the interleaving DAC by adding a canceling image equal and opposite to the interleaving image to the digital input signal provided to the interleaved DAC. FIG. 17 illustrates a digital interleaving image pre-canceler 1700 that can include a timing mismatch pre-canceler 1702 and a gain mismatch pre-canceler 1704 for higher-resolution correction of the residual timing and gain mismatches, e.g., following analog trim that can be performed as described above using, for example, circuitry as shown in FIGS. 13-16. Timing and gain mismatch pre-cancellation can happen in sequence, as shown in FIG. 17, allowing the timing mismatch pre-canceler 1702 to be designed to assume that the DAC impairment model does not include a gain mismatch: from the point of view of the timing mismatch pre-canceler 1702, its output signal y(n) goes into a DAC that does not have gain mismatch because gain mismatch pre-canceler block 1704 removes any such gain mismatch.

Thus, in some examples, digital timing mismatch pre-canceler 1702 can be used to correct residual mismatch left after coarse analog correction. The two timing error parameters of the timing mismatch impairment model, $\delta$ and $\gamma$, can be used to configure the digital timing mismatch pre-canceler 1702. For timing mismatch correction, timing mismatch pre-canceler 1702 can create a spectral image of the desired signal with an amplitude and phase equal to and opposite of, and therefore capable of canceling, the residual interleaving image in analog. Gain mismatch pre-canceler 1704 can perform gain mismatch correction according to the single gain mismatch parameter $\alpha$. The term "pre-canceler" indicates that, in effect, an anti-interleaving image is deliberately added to the signal, at the interleaving image frequency $f_{DAC}/2-f_{in}$, with the appropriate scaling and phase imparted to the anti-interleaving image, at a point in the signal pathway prior to when a corresponding interleaving image is introduced to the signal by the interleaving DAC; the interleaving image is effectively canceled by, or itself cancels, the pre-introduced anti-interleaving image generated by the digital pre-canceler circuitry 1900.

Figure 18:
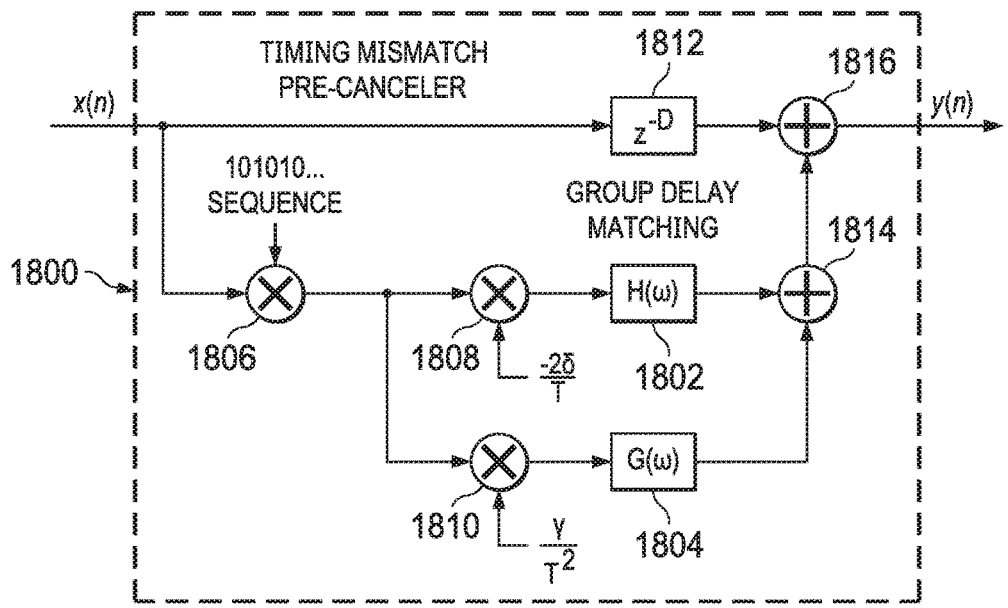
FIG. 18 is a digital signal flow diagram of an example timing mismatch pre-canceler.

FIG. 18 illustrates an example timing mismatch pre-canceler 1800 that can be used to implement timing mismatch pre-canceler 1702 in FIG. 17. In-phase and quadrature components of the anti-interleaving image can be respectively created using frequency-shaping filters $H(\omega)$ 1802 and $G(\omega)$ 1804. The image generation path for pre-cancellation can include a first multiplier 1806 configured to perform multiplication of the input signal x(n) by a [1, 0, 1, 0, 1, 0 . . . ] binary sequence to create an interleaving image. This multiplication also allows subsequent filtering to be done as alternating polyphases, significantly reducing filtering complexity and improving power efficiency as compared, for example, to a multiplication of the input data stream x(n) by a sequence of the pattern [1, −1, 1, −1 . . . ], which would induce a frequency shift of $f_{DAC}/2$. By multiplying by [1, 0, 1, 0, 1, 0 . . . ], the input signal experiences a gain change when the scaled "image" stream is added to main data path at summer 1816, but distortion from such a gain change is of the order of the IL mismatch, which is below −40 dBc and is in some examples therefore negligible.

For frequency shaping and phase control, the generated "image" stream can be processed through scaling multipliers 1808, 1810 and frequency shaped by passing through two parallel filters 1802, 1804. A first filter, $H(\omega)$ 1802, can be configured to have an integer group delay, for example as an odd-length symmetric fixed-coefficient FIR filter that compensates for falling edge mismatch and has a response approximating:

$$H(\omega) = \left(\frac{\omega}{2}\right) \frac{\cos\left(\frac{\omega}{2}\right)}{\sin\left(\frac{\omega}{2}\right)} e^{-j\omega D}$$

in terms of discrete frequency $\omega$.

A second filter, $G(\omega)$ 1804, can be configured to have an integer minus half-integer group delay, for example as an even-length anti-symmetric fixed-coefficient FIR filter that compensates for the impulse mismatch and has a response approximating:

$$G(\omega) = (j\omega) \frac{\left(\frac{\omega}{2}\right)}{\sin\left(\frac{\omega}{2}\right)} e^{-j\omega\left(D-\frac{1}{2}\right)}.$$

The above two example filter response expressions for $H(\omega)$ and $G(\omega)$ correspond to a "first order approximation" model presented for input signal frequency profile $G(f)$, above. Including higher order terms slightly modifies the responses $H(\omega)$ and $G(\omega)$, and the scaling factors related to parameters $\delta$ and $\gamma$. Thus, in some examples, frequency responses other than those given above can be targeted for $H(\omega)$ and $G(\omega)$, and the values supplied to multipliers 1808, 1810 can be adjusted accordingly or made programmable.

Second multiplier 1808 can scale the input to the first digital filter $H(\omega)$ 1802 by a programmable scale factor related to the mismatch parameter $\delta$, for example, $-2\delta/T$ Third multiplier 1810 can scale the input to the second digital filter $G(\omega)$ 1804 by a programmable scale factor related to the mismatch parameter $\gamma$, for example, $\gamma/T^2$. Because any practical FIR filter will have a group delay, and because FIR filters 1802, 1804 can be designed to be linear phase filters having an integer group delay component, the path carrying original signal x(n) (shown along the top of FIG. 18) can include group delay matching component 1812, where D represents the group delay of the discrete-time filter 1802 to correct for the falling edge mismatch. Group delay of the impulse discharge correction filter 1804 is half a sample less than D. The output of group delay matching component 1812 can be summed with the sum of the multiplied digital filter outputs by summers 1814, 1816 to produce timing mismatch pre-canceler output y(n). In another example, multiplier 1806 can multiply by a sequence of the pattern [1, −1, 1, −1 . . . ], negating alternate samples in digital, which is effectively equivalent to performing an $f_{DAC}/2$ shift of the input signal, digitally, which will produce a component at the image location $f_{DAC}/2-f_{in}$.

In some examples, filter 1802 is a linear-phase filter with an odd number of taps, producing an integer group delay, while filter 1804 is a linear-phase filter with an even number of taps, producing an integer-minus-half-sample group delay. To ensure that the component produced by filter 1802 is in phase with the input signal and the component produced by filter 1804 is in quadrature with the input signal, filter 1802 can be configured as a symmetric filter whereas an anti-symmetric filter can be chosen as filter 1804.

Figure 19:
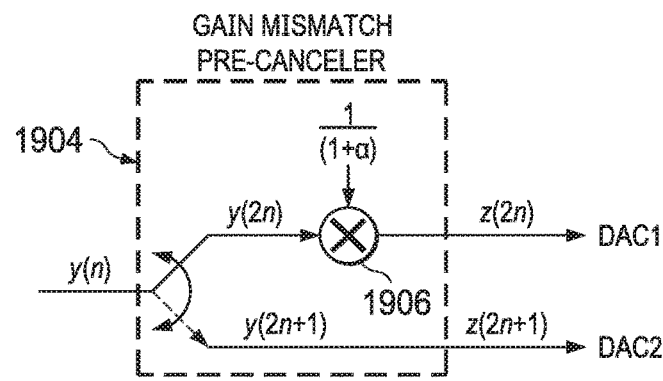
FIG. 19 is a digital signal flow diagram of an example gain mismatch pre-canceler.

FIG. 19 illustrates an example gain mismatch pre-canceler 1904 that can be used to implement gain mismatch pre-canceler 1704 in FIG. 17. Gain mismatch pre-canceler 1904 can perform gain mismatch correction by scaling half the samples going to one of the two DACs DAC1, DAC2 (corresponding, for example, to DAC1, DAC2 in FIG. 6, or DAC1 1102, DAC2 1004 in FIG. 11) in proportion to the single gain mismatch parameter $\alpha$. Digital gain mismatch pre-canceler 1904 includes digital multiplier 1906 configured to provide a scaled version of first alternate samples of the input y(n) of digital gain mismatch pre-canceler 1904 to the first output z(2n) to DAC1 and to provide unscaled second alternate samples of the input y(n) of digital gain mismatch pre-canceler circuitry 1904 to the second output z(2n+1) to DAC2.

In some examples digital interleaving correction circuitry 1700 can be included without accompanying analog interleaving correction circuitry (as shown in FIGS. 11-16) or vice-versa. However, because digital interleaving correction circuitry 1700 may not work properly if switching signals $\phi_1$ and $\phi_2$ are overlapping (that is, asserted at the same time), it may be important to include in the interleaving DAC system analog interleaving correction circuitry with enough range to ensure that switching signals $\phi_1$ and $\phi_2$ can be rendered non-overlapping.

Figure 20:
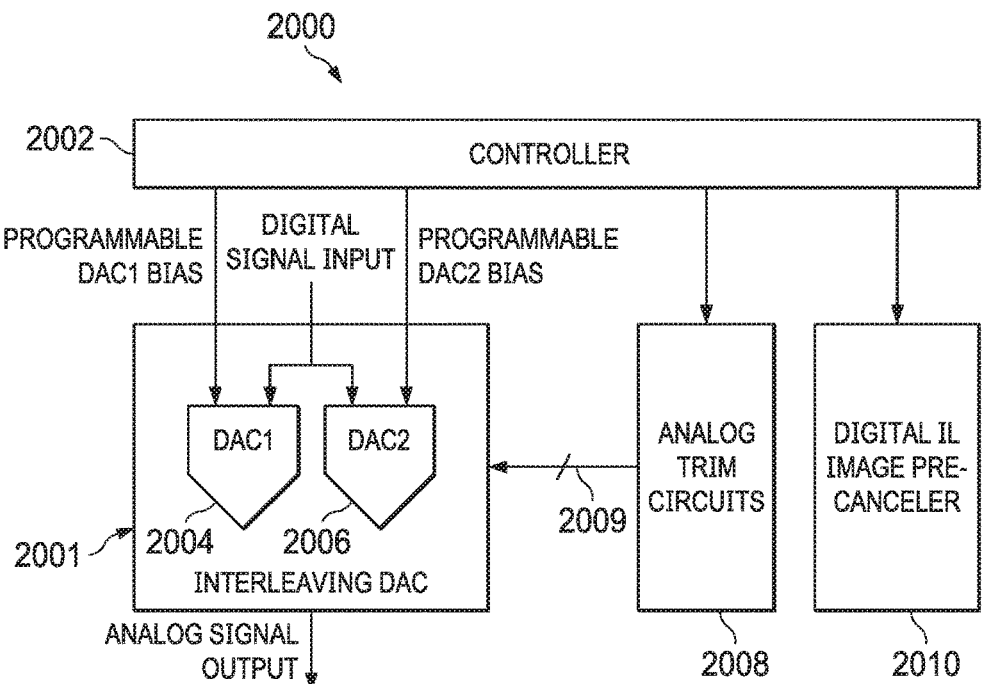
FIG. 20 is a block diagram of an example interleaving DAC analog and digital error correction system including a controller.

The block diagram of FIG. 20 shows an interleaving error correction system 2000 for an interleaving DAC 2001, the system 2000 including a controller 2002 (e.g., a microcontroller) that can be employed to split the correction between analog and digital elements, examples of which have been described above. Coarse correction can be applied using analog circuitry and finer corrections can be applied using digital circuitry. The analog circuitry can include the two independently programmable biases to the two DACs 2004, 2006 and the various programmable current sources and capacitors in analog switching clock edge timing adjustment circuitry (labeled as "analog trim circuits") 2008, which can include, as examples, circuits such as those illustrated in FIGS. 13-16. One or more outputs 2009 of this analog switching clock edge timing adjustment circuitry can be provided as one or more inputs to the interleaving DAC 2001 and configured to independently adjust the timing of rising and falling edges of first and second digital switching clock signals used by the interleaving DAC 2001. As an example, when the interleaving DAC 2001 is of the form shown in FIG. 6, the analog switching clock edge timing adjustment circuitry 2008 can be configured to switch the switches 602, 604, 606, 608 by providing outputs 2009 to switching control inputs of the switches 602, 604, 606, 608. The digital circuitry 2010 can include, for example, the timing mismatch pre-canceler 1702 and the gain mismatch pre-canceler 1704 of the digital interleaving image pre-canceler 1700 as illustrated in FIG. 17, examples of which are respectively given in FIGS. 18 and 19.

Figure 21:
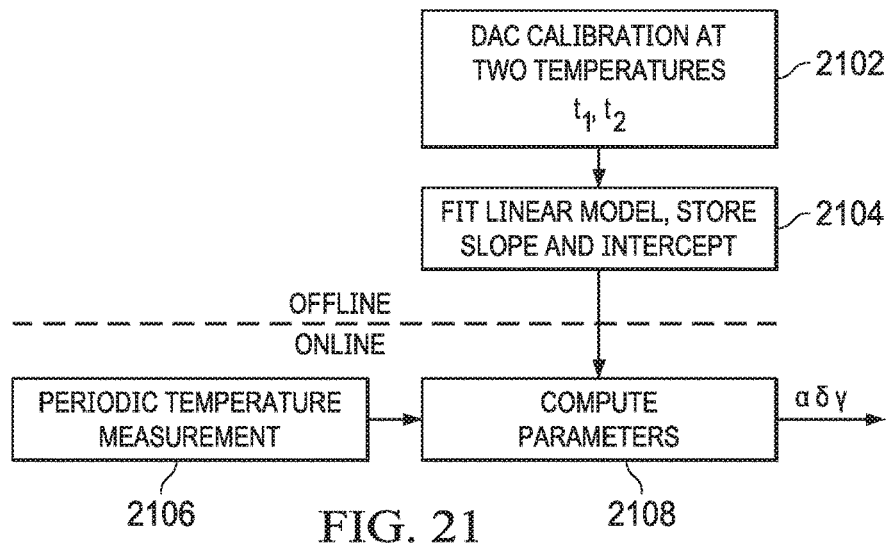
FIG. 21 is a flow diagram of an example method of temperature adjustment control for interleaving DAC error correction.

The controller 2002 of FIG. 20 can also be configured to keep track of the temperature variance of mismatch parameters α, δ, and γ and provide temperature-adjusted values for these mismatch parameters to the analog and/or digital adjustment circuitry. For example, the controller 2002 can measure the temperature of the DAC circuitry periodically and supply updated values for the correction parameters to the correction circuitry. Such updated values can be supplied, for example, from a temperature table of such values stored in a memory, which table can be provided with the system 2000 or can be user-programmable or automatically calibrated. As another example, appropriate parameter values can be computed on-the-fly using a linear model, as shown in FIG. 21. The controller 2002 accordingly can have temperature-adaptable control over the programmable DC biases and all the correction circuits 2008, 2010. In some examples, controller 2002 only supplies temperature-updated parameters to the digital correction circuitry 2010, exploiting the fact that in most cases temperature-adjusting only the digital correction circuitry suffices to make fined-tuned corrections. Connections from outputs of the analog trim circuits 2008 and the digital interleaving image pre-canceler 2010 to inputs of the DACs 2004, 2006 or other circuitry are omitted from FIG. 20 for the sake of simplicity in showing the arrangement between controller 2002 and the other components of system 2000.

FIG. 21 shows an example method of providing temperature-adjusted mismatch parameters α, δ, and γ. Offline, i.e., independently of the real-time operation of interleaving error correction system 2000, the interleaving DAC can be calibrated 2102 at, for example, two different temperatures, $t_1$ and $t_2$. For each of the two temperatures, the calibration determines values of the mismatch parameters α, δ, and γ adequate to make the desired error corrections. Also offline, each of the parameters is fit 2104 to a linear model, and slope and intercept values for each such model are stored 2104. Then, online, i.e., during the real-time operation of the interleaving error correction system 2000, periodic temperature measurements are made 2106 of the system 2000, e.g., by an on-chip temperature sensor. Controller 2002 can then use the stored slope and intercept values to compute 2108 temperature-adjusted values of the mismatch parameters α, δ, and γ used in the interleaving error correction circuitry shown in FIG. 20. In other examples, temperature tracking can be done by making offline measurements at multiple temperatures $t_1, t_2, \ldots t_N$, a piece-wise polynomial model can be derived for each mismatch parameter, and parameters of each piece-wise polynomial model can be stored for online polynomial interpolation of mismatch parameters.

Figure 22:
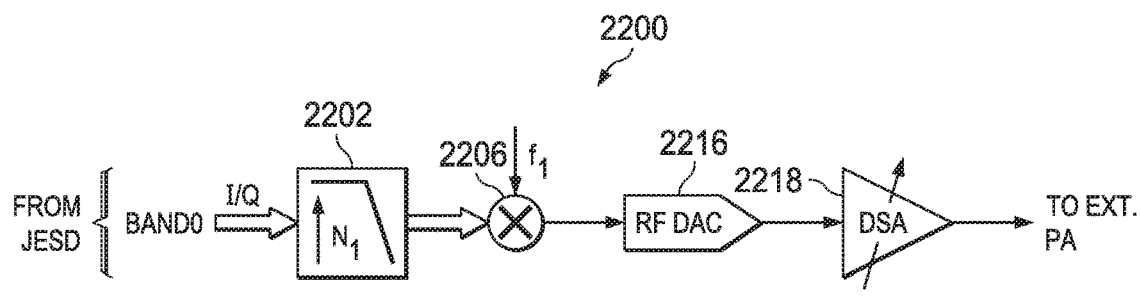
FIG. 22 is a block diagram of an example single-band RF sampling transmitter with a digital up-converter (DUC) feeding into an RF DAC.

FIG. 22 shows an example single-band RF sampling transmitter 2200 with a digital up-converter (DUC) for an RF sampling DAC 2216. Digital input signal BAND0 is provided to interpolator 2202, which is configured to increase the sampling rate of digital input signal BAND0 before digital multiplication at multiplier 2206. In some examples, further upsampling and multiplication can be performed at an additional interpolator and multiplier (not shown). The digital signal can then be provided to RF DAC 2216 for conversion to an analog signal and provision to a digital step attenuator 2218 and an external power amplifier (PA) (not shown). Current element mismatches (both static and dynamic) in the DAC 2216 can limit its spurious performance (SFDR). Dynamic mismatches degrade with the speed of the DAC 2216. DAC SFDR degrades at higher sampling frequencies $f_s$. Running the DAC 2216 in a 2× interleaved fashion improves DAC harmonic distortion and improves ACPR. However, as discussed above, interleaving leads to an interleaving image; for every desired output frequency $f_{out}$, there is an interleaving image at $f_s/2-f_{out}$.

Figure 23:
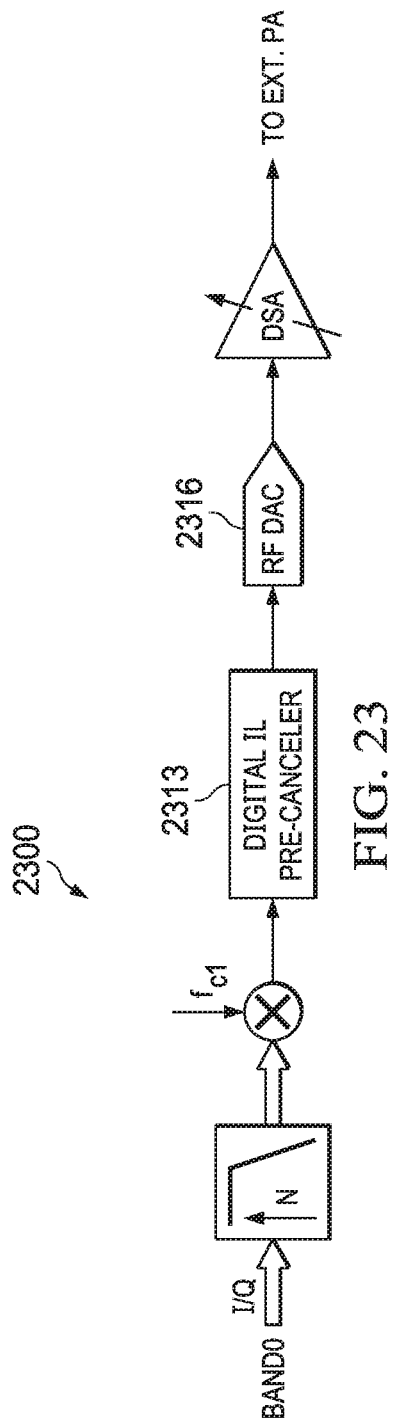
FIG. 23 is a block diagram of an example single-band RF sampling transmitter with a DUC feeding into digital interleaving image pre-canceler circuitry prior to feeding into an interleaving DAC.

FIG. 23 illustrates single-band RF sampling transmitter similar to that of FIG. 22 with DUC 2300 with a digital interleaving image pre-canceler 2313 implemented at a point in the signal chain prior to provision of the signal to the interleaving DAC 2316. The illustrated signal chain can implement an interleaving mismatch model as described above, e.g., with regard to FIG. 6, for example, using both analog and digital correction components. The digital correction components can be provided in digital pre-canceler 2313, which can provide anti-interleaving images in the digital stream provided to the interleaving DAC 2316 to mitigate interleaving images generated by the DAC 2316 and provide enhanced-quality digital-to-analog conversion at lower power than achievable in non-interleaved DAC systems.

Figure 24:
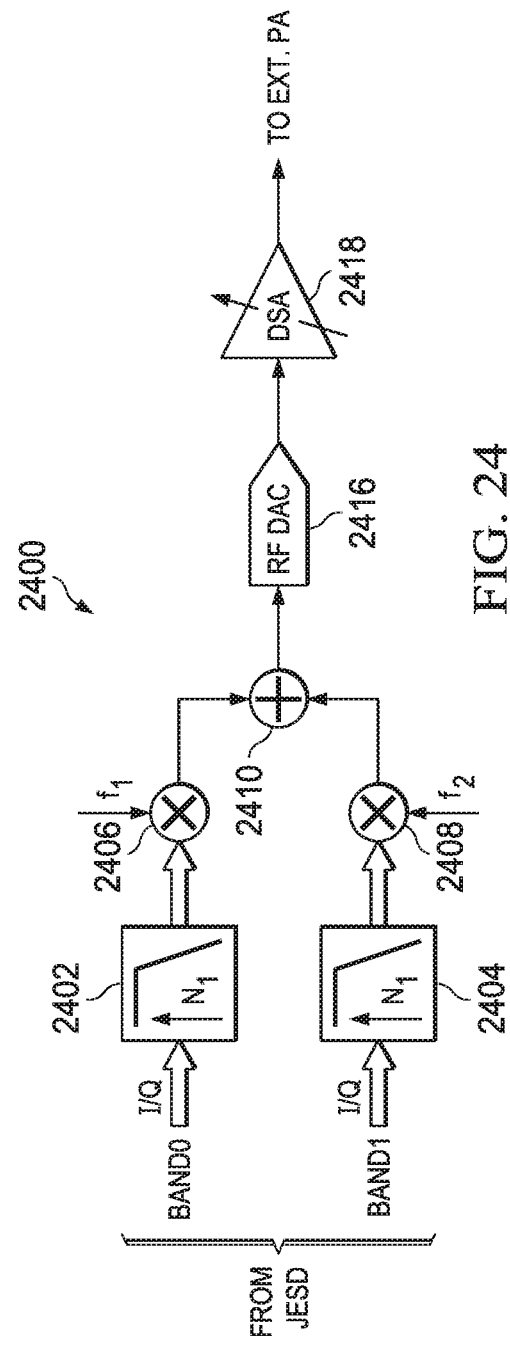
FIG. 24 is a block diagram of an example dual-band RF sampling transmitter with a digital up-converter (DUC) feeding into an RF DAC.

FIG. 24 shows an example dual-band RF sampling transmitter 2400 with a digital up-converter (DUC) supporting dual bands for an RF sampling DAC 2416. Digital input signals BAND0, BAND1 can come, for example, from a serial interface for bridging logic devices, such as FPGAs or ASICs, to the DUC 2400. Interpolators 2402, 2404 increase the sampling rate before digital multiplication at multipliers 2406, 2408 and combination of the signals at digital summer 2410. In some examples, further upsampling and multiplication can be provided with an additional interpolator and multiplier (not shown). The digital signal can then be provided to RF DAC 2416 for conversion to an analog signal and provision to a digital step attenuator 2418 and an external power amplifier (PA) (not shown). Current element mismatches (both static and dynamic) in the DAC 2416 can limit its spurious performance (SFDR). Dynamic mismatches degrade with the speed of the DAC 2416. DAC SFDR degrades at higher sampling frequencies $f_s$. Running the DAC 2416 in a 2× interleaved fashion improves DAC harmonic distortion and improves ACPR. However, as discussed above, interleaving leads to an interleaving image; for every desired output frequency $f_{out}$, there is an interleaving image at $f_s/2-f_{out}$.

Figure 25:
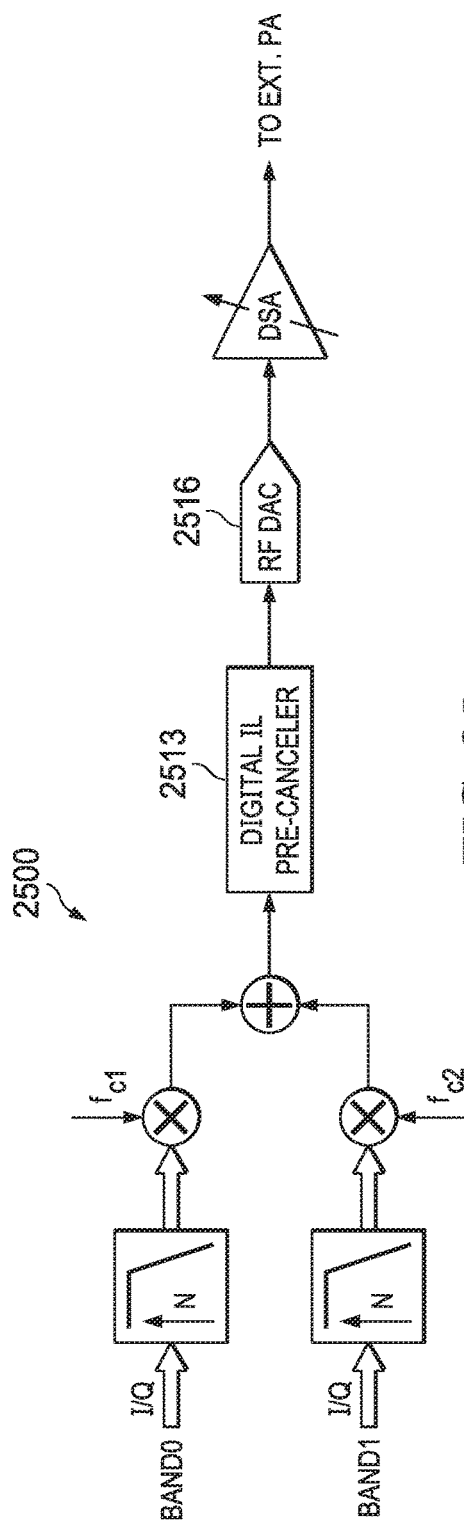
FIG. 25 is a block diagram of an example dual-band RF sampling transmitter with a DUC feeding into digital interleaving image pre-canceler circuitry prior to feeding into an interleaving DAC.

FIG. 25 illustrates an RF sampling transmitter similar to that of FIG. 24 with DUC 2500 with a digital interleaving image pre-canceler 2513 implemented at a point in the signal chain prior to provision of the signal into the interleaving DAC 2516. The illustrated signal chain can implement an interleaving mismatch model as described above, e.g., with regard to FIG. 6, for example, using both analog and digital correction components. The digital correction components can be provided in digital pre-canceler 2513, which can provide anti-interleaving images in the digital stream provided to the interleaving DAC 2516 to mitigate interleaving images generated by the DAC 2516 and provide enhanced-quality digital-to-analog conversion at lower power than achievable in non-interleaved DAC systems.

Figure 26:
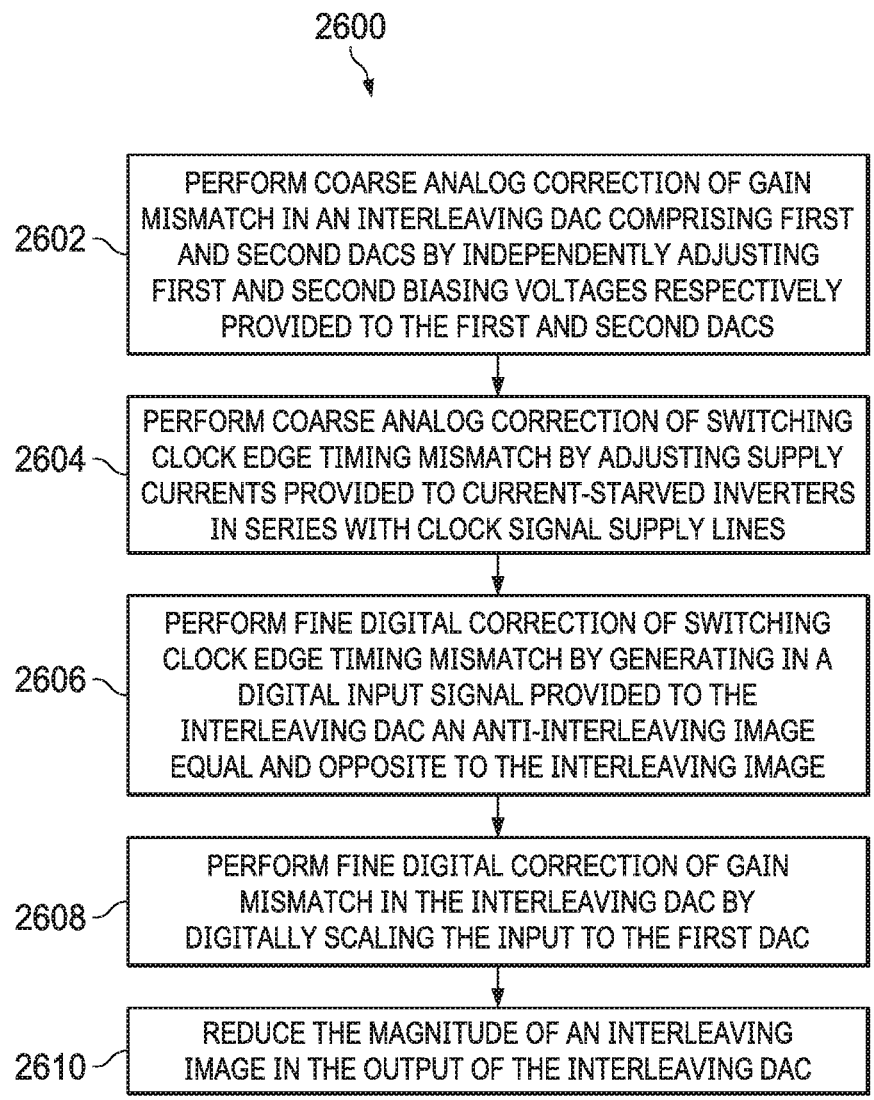
FIG. 26 is a flow diagram of an example method of interleaving DAC error correction.

FIG. 26 illustrates a method 2600 of interleaving error correction. Coarse analog correction of gain mismatch in an interleaving DAC comprising first and second DACs can be performed 2602 by independently adjusting first and second biasing voltages respectively provided to the first and second DACs. Coarse analog correction of switching clock edge timing mismatch can be performed 2604 by adjusting supply currents provided to current-starved inverters in series with clock signal supply lines. The coarse analog correction of the gain mismatch and the switching clock edge timing mismatch can reduce 2610 the magnitude of an interleaving image in the output of the interleaving DAC. The method can further include performing 2606 fine digital correction of switching clock edge timing mismatch by generating in a digital input signal provided to the interleaving DAC an anti-interleaving image equal and opposite to the interleaving image, and performing 2608 fine digital correction of gain mismatch in the interleaving DAC by digitally scaling the input to the first DAC. The fine digital correction of the switching clock edge timing mismatch and the gain mismatch can reduce 2610 the magnitude of the interleaving image in the output of the interleaving DAC.

Because the enhanced interleaving model 600 of FIG. 6 takes into account the interleaved DAC behavior more fully than other models developed, the interleaving error correction methods and systems described herein can model RF DAC mismatch with one gain mismatch parameter ($\alpha$) and two timing mismatch parameters ($\delta$ and $\gamma$), enabling analog plus digital interleaving mismatch correction. The interleaving error correction methods and systems described herein can employ analog trims for the DAC currents and timing edges to reduce the dynamic range of the residual mismatches for digital correction. The interleaving error correction methods and systems described herein can perform fine-tuned digital correction with a pre-canceler, by introducing an image level with the same gain and opposite phase as the residual interleaving image in analog. The interleaving error correction methods and systems described herein can further employ two fixed coefficient filters and parametrized scalers to create the interleaving image to correct for residual timing mismatch, covering both in-phase and quadrature interleaving image components. The interleaving error correction methods and systems described herein can still further employ different scales on alternate samples to account for residual gain mismatch. As an example, the interleaving error correction methods and systems described herein are capable of achieving better than −65 dBc correction across the Nyquist band, e.g., in the frequency range from 500 MHz to 3.5 GHz in a 9 GSPS DAC. As an example, without correction, an interleaving image created by an RF DAC could be as large as −40 dBc in the same frequency range. As another example, for a 12 GSPS DAC, the adjacent channel power ratio (ACPR) can be made 3 to 4 dB better in the interleaved mode compared to the non-interleaved mode.

An interleaving DAC with IL image correction as described herein can be implemented in an integrated transceiver incorporated into a variety of electronic systems. Such systems include, as examples, wireless base stations, test systems, measurement systems, and radar systems.

Figure 27:
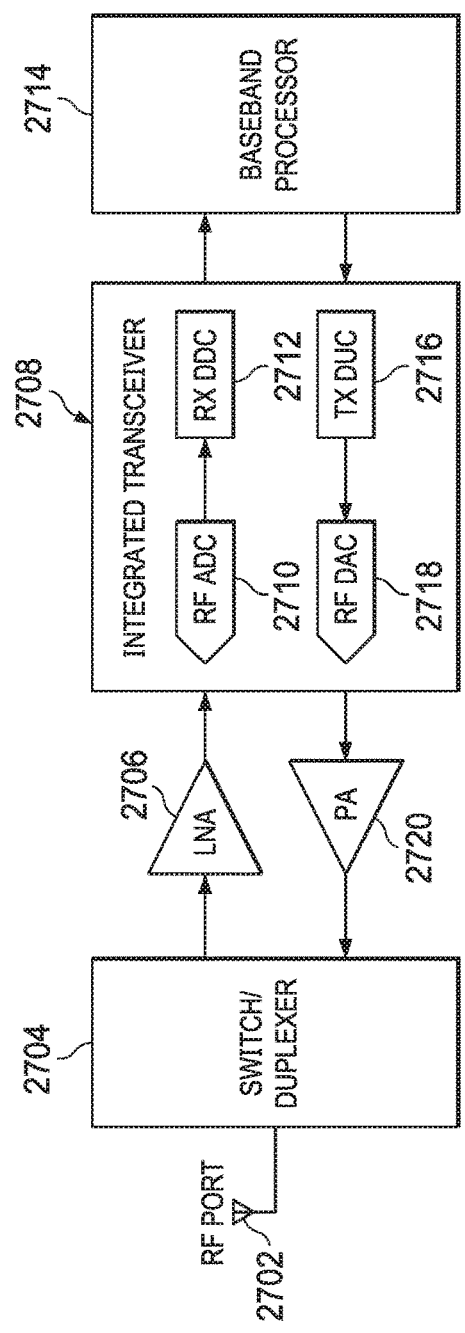
FIG. 27 is a block diagram of an example wireless base station transceiver system.

FIG. 27 illustrates an example wireless base station transceiver system 2700, e.g., for 5G systems, with an integrated transceiver 2708 that includes an RF sampling transmitter with a high-speed, high-performance transmitter (TX) DUC 2716 and an RF sampling DAC 2718 operating at multi-GSPS rates (e.g, 12 GSPS). Baseband processor 2714 provides complex baseband I/Q samples to integrated transceiver 2708, which interpolates, filters, and up-converts the complex baseband I/Q samples to a specified RF frequency. The RF sampling transmitter can include IL image correction circuitry (not specifically shown) configured to correct for sources of IL error, for example, by providing coarse analog correction and fine-grained digital pre-cancellation. The IL image correction circuitry can be according to any of the examples described above and illustrated in FIGS. 11 and 13-21. An output RF signal from integrated transceiver 2708 is provided to power amplifier 2720, which amplifies the output RF signal. The output of power amplifier 2720 is provided to switch or duplexer 2704 that couples the output RF signal to RF port 2702 for transmission. For example, RF port 2702 can be an antenna that transmits the output RF signal wirelessly.

Additionally, an input RF signal can be received at RF port 2702 and coupled to a low-noise amplifier (LNA) 2706 by switch or duplexer 2704. The input RF signal can be amplified by LNA 2706 and provided to integrated transceiver 2708. Integrated transceiver 2708 may then employ an RF analog-to-digital converter (ADC) to sample the received RF signal and a receiver (RX) digital down-converter (DDC) to down-convert, filter, and decimate samples output from RF ADC 2710 to generate received complex baseband I/Q samples. The received complex baseband I/Q samples can be provided to baseband processor 2714 for further processing. The example transceiver system 2700 illustrated in FIG. 27 is for a wireless base station. Similar block diagrams are applicable to radar systems and test-and-measurement systems.

The systems described herein can be implemented, and the methods described herein can be carried out, using an application-specific integrated circuit (ASIC) or multiple coupled ASICs; as a field-programmable gate array (FPGA) or multiple coupled FPGAs; or within a digital signal processor (DSP) or multiple coupled DSPs. In this description, the term "based on" means based at least in part on. In this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

Modifications are possible in the described embodiments, and other embodiments are possible, within the scope of the claims.

What is claimed is:

1. An interleaving digital-to-analog converter (DAC) system comprising:
    an interleaving DAC comprising an analog signal output and first and second DACs, each of the first and second DACs having an independently adjustable bias voltage, the first and second DACs having respective first and second digital signal inputs; and
    analog switching clock edge timing adjustment circuitry configured to independently adjust the timing of rising and falling edges of first and second digital switching clock signals used by the interleaving DAC, the analog switching clock edge timing adjustment circuitry having clock signal outputs coupled to clock signal inputs of the interleaving DAC to provide the interleaving DAC with the first and second digital switching clock signals,
    a voltage of the analog signal output of the interleaving DAC being a voltage output of the first DAC during a high value of the first digital switching clock signal and a voltage output of the second DAC during a high value of the second digital switching clock signal.

2. The system of claim 1, wherein the analog switching clock edge timing adjustment circuitry comprises, for each of the first and second digital switching clock signals, first and second stages coupled in series with each other, each of the first and second stages comprising:
    a clock signal input;
    a current-starved inverter having:
        an inverter input coupled to the clock signal input,
        first and second current-source connections, and
        an inverter output;
    an adjustable capacitor coupled at a first end to the inverter output and at a second end to a circuit ground,
    a first adjustable current source coupled at a first end of the first adjustable current source to a power supply node and coupled at a second end of the first adjustable current source to the first current-source connection of the current-starved inverter; and
    a second adjustable current source coupled at a first end of the second adjustable current source to the second current-source connection of the current-starved inverter and coupled at a second end of the second adjustable current source to the circuit ground.

3. The system of claim 1, further comprising digital interleaving image pre-canceler circuitry coupled to the first and second digital signal inputs of the first and second DACs, the digital interleaving image pre-canceler circuitry configured to generate a digital signal including an anti-interleaving image equal and opposite of an interleaving image produced by the interleaving DAC.

4. The system of claim 3, the digital interleaving image pre-canceler circuitry comprising:
    digital timing mismatch pre-canceler circuitry having an output;
    digital gain mismatch pre-canceler circuitry having an input coupled to the output of the digital timing mismatch pre-canceler circuitry and having first and second outputs coupled to respective digital signal inputs of the first and second DACs.

5. The system of claim 4, the digital timing mismatch pre-canceler circuitry comprising:
    a digital timing mismatch pre-canceler input;
    group delay matching circuitry coupled at an input of the group delay matching circuitry to the digital timing mismatch pre-canceler input and coupled at an output of the group delay matching circuitry to a first input of first summer circuitry;
    frequency-shifting circuitry coupled at an input of the frequency-shifting circuitry to the digital timing mismatch pre-canceler input, the frequency-shifting circuitry being configured to multiply an input signal provided at the digital timing mismatch pre-canceler input by a repeating sequence;
    first scaling circuitry coupled at an input of the first scaling circuitry to an output of the frequency-shifting circuitry;
    a first frequency-shaping filter coupled at an input of the first frequency-shaping filter to an output of the first scaling circuitry and coupled at an output of the first frequency-shaping filter to a first input of second summer circuitry, the first frequency-shaping filter being configured to provide an in-phase component of the anti-interleaving image;
    second scaling circuitry coupled at an input of the second scaling circuitry to an output of the frequency-shifting circuitry; and
    a second frequency-shaping filter coupled at an input of the second frequency-shaping filter to an output of the second scaling circuitry and coupled at an output of the second frequency-shaping filter to a second input of the second summer circuitry, the second frequency-shaping filter being configured to provide a quadrature component of the anti-interleaving image,
    the first summer circuitry being coupled at a second input of the first summer circuitry to an output of the second summer circuitry, and an output of the first summer circuitry providing an output of the digital timing mismatch pre-canceler circuitry.

6. The system of claim 5, wherein the repeating sequence is either a [1, −1, 1, −1, . . . ] sequence or a [1, 0, 1, 0 . . . ] sequence.

7. The system of claim 5, wherein the first frequency-shaping filter is an odd-length symmetric fixed-coefficient FIR filter with an integer group delay.

8. The system of claim 7, wherein the second frequency-shaping filter is an even-length anti-symmetric fixed-coefficient FIR filter with an integer minus half-integer group delay.

9. The system of claim 4, the digital gain mismatch pre-canceler circuitry comprising a digital multiplier configured to provide a scaled version of first alternate samples of the input of the digital gain mismatch pre-canceler circuitry to the first output of the digital gain mismatch pre-canceler circuitry and to provide unscaled second alternate samples of the input of the digital gain mismatch pre-canceler circuitry to the second output of the digital gain mismatch pre-canceler circuitry.

10. The system of claim 3 further comprising a controller having a first programmable bias output coupled to a bias input of the first DAC and a second programmable bias output coupled to a bias input of the second DAC, the controller being configured to supply a first independent bias voltage to the first DAC via the first programmable bias output and a second independent bias voltage to the second DAC via the second programmable bias output,
    the controller further having a clock edge control output coupled to an input of the analog switching clock edge timing adjustment circuitry, the controller being configured to provide clock edge control signals to the analog switching clock edge timing adjustment circuitry via the clock edge control output, and the controller further having one or more mismatch parameter outputs coupled to one or more inputs of the digital interleaving image pre-canceler circuitry, the controller being configured to provide mismatch parameter values to the digital interleaving image pre-canceler circuitry via the one or more mismatch parameter outputs.

11. The system of claim 10, wherein the controller is configured to supply at least one of the first and second independent bias voltages, the clock edge control signals, or the mismatch parameter values adjusted for temperature.

12. The system of claim 11, wherein the controller is configured to adjust the mismatch parameter values by computing the temperature-adjusted parameter values based on stored linear or polynomial model parameters and based on a periodic temperature measurement.

13. The system of claim 1, wherein the interleaving DAC system is implemented in an integrated transceiver incorporated into a wireless base station, a test-and-measurement system, or a radar system.

14. A method of interleaving error correction comprising:
performing coarse analog correction of gain mismatch in an interleaving DAC comprising first and second DACs by independently adjusting first and second biasing voltages respectively provided to the first and second DACs; and
performing coarse analog correction of switching clock edge timing mismatch by adjusting supply currents provided to current-starved inverters in series with clock signal supply lines,
the coarse analog correction of the gain mismatch and the switching clock edge timing mismatch reducing a magnitude of an interleaving image in the output of the interleaving DAC.

15. The method of claim 14, further comprising:
performing fine digital correction of switching clock edge timing mismatch by generating in a digital input signal provided to the interleaving DAC an anti-interleaving image equal and opposite to the interleaving image;
performing fine digital correction of gain mismatch in the interleaving DAC by digitally scaling a digital signal input to the first DAC.

16. The method of claim 15, wherein the generating the anti-interleaving image comprises adding to the digital input signal a scaled in-phase component of the anti-interleaving image created using a first frequency-shaping filter.

17. The method of claim 16, wherein the generating the anti-interleaving image further comprises adding to the digital input signal a scaled quadrature and half-sample delayed component of the anti-interleaving image created using a second frequency-shaping filter.

18. The method of claim 17, further comprising scaling the in-phase and quadrature components based on mismatch parameters that are corrected for temperature, wherein the correction for temperature of the mismatch parameters comprises periodically measuring an on-chip temperature and computing the mismatch parameters based on the measured on-chip temperature using linear or polynomial models of temperature dependence of the mismatch parameters.

19. A wireless base station transceiver system comprising:
a baseband processor having an output, the baseband processor being configured to provide complex baseband I/Q samples via the output;
an integrated transceiver having a first input and a first output, the first input being coupled to the output of the baseband processor, the integrated transceiver being configured to interpolate, filter, and up-convert the complex baseband I/Q samples to an RF frequency, the integrated transceiver comprising:
a radio-frequency (RF) sampling transmitter comprising a transmitter (TX) digital up-converter (DUC) having an output, and
an RF sampling digital-to-analog converter (DAC) having a sample-and-hold response, the RF sampling DAC having an input coupled to the output of the TX DUC,
wherein the RF sampling transmitter further comprises interleaving image correction circuitry configured to correct for sources of interleaving error by providing coarse analog correction and fine-grained digital pre-cancellation;
a power amplifier having an input coupled to the first output of the integrated transceiver, the power amplifier being configured to amplify an analog RF output signal from the integrated transceiver; and
an RF port coupled to an output of the power amplifier and configured to transmit the amplified analog RF output signal from the power amplifier.

20. The wireless base station transceiver system of claim 19,
wherein the RF port is coupled to the output of the power amplifier via a switch or duplexer;
wherein the RF port is further coupled to an input of a low-noise amplifier (LNA) via the switch or duplexer, the LNA being configured to amplify an input RF signal from the RF port;
wherein an output of the LNA is coupled to a second input of the integrated transceiver configured to provide the amplified input RF signal to the integrated transceiver;
wherein the integrated transceiver further comprises:
an RF analog-to-digital converter (ADC) having an output, the RF ADC being configured to sample the amplified input RF signal, and
a receiver (RX) digital down-converter (DDC) having an input coupled to the output of the RF ADC, the RX DDC being configured to down-convert, filter, and decimate samples output from RF ADC to generate received complex baseband I/Q samples; and
wherein the baseband processor further comprises an input coupled to a second output of the integrated transceiver, the baseband processor being configured to further process the received complex baseband I/Q samples from the RX DDC.

21. An integrated transceiver comprising:
an input;
an output;
a radio-frequency (RF) sampling transmitter comprising a transmitter (TX) digital up-converter (DUC) having an output, and
an RF sampling digital-to-analog converter (DAC) having a sample-and-hold response, the RF sampling DAC having an input coupled to the output of the TX DUC,
wherein the RF sampling transmitter further comprises interleaving image correction circuitry configured to correct for sources of interleaving error by providing coarse analog correction and fine-grained digital pre-cancellation;
a power amplifier having an input coupled to the output of the integrated transceiver, the power amplifier being configured to amplify an analog RF output signal from the integrated transceiver; and an RF port coupled to an output of the power amplifier and configured to transmit the amplified analog RF output signal from the power amplifier.

22. The integrated transceiver of claim 21,
wherein the RF port is coupled to the output of the power amplifier via a switch or duplexer;
wherein the RF port is further coupled to an input of a low-noise amplifier (LNA) via the switch or duplexer, the LNA being configured to amplify an input RF signal from the RF port;
wherein an output of the LNA is coupled to the input of the integrated transceiver configured to provide the amplified input RF signal to the integrated transceiver;
wherein the integrated transceiver further comprises:
   an RF analog-to-digital converter (ADC) having an output, the RF ADC being configured to sample the amplified input RF signal, and
   a receiver (RX) digital down-converter (DDC) having an input coupled to the output of the RF ADC, the RX DDC being configured to down-convert, filter, and decimate samples output from RF ADC to generate received complex baseband I/Q samples.

* * * * *